United States Patent
Rivero et al.

(10) Patent No.: US 9,263,518 B2
(45) Date of Patent: Feb. 16, 2016

(54) COMPONENT, FOR EXAMPLE NMOS TRANSISTOR, WITH ACTIVE REGION WITH RELAXED COMPRESSION STRESSES, AND FABRICATION METHOD

(71) Applicant: STMicroelectronics (Rousset) SAS, Rousset (FR)

(72) Inventors: Christian Rivero, Rousset (FR); Guilhem Bouton, Peynier (FR); Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/300,663

(22) Filed: Jun. 10, 2014

(65) Prior Publication Data
US 2014/0367784 A1  Dec. 18, 2014

(30) Foreign Application Priority Data
Jun. 13, 2013  (FR) ..................................... 13 55476

(51) Int. Cl.
| | |
|---|---|
| *H01L 29/78* | (2006.01) |
| *H01L 27/06* | (2006.01) |
| *H01L 29/06* | (2006.01) |
| *H01L 21/762* | (2006.01) |
| *H01L 29/66* | (2006.01) |
| *H01L 29/08* | (2006.01) |
| *H01L 23/522* | (2006.01) |

(52) U.S. Cl.
CPC ...... *H01L 29/0653* (2013.01); *H01L 21/76224* (2013.01); *H01L 21/76229* (2013.01); *H01L 23/5226* (2013.01); *H01L 29/0649* (2013.01); *H01L 29/0847* (2013.01); *H01L 29/66568* (2013.01); *H01L 29/7846* (2013.01)

(58) Field of Classification Search
CPC ..................... H01L 29/7846; H01L 21/76224; H01L 29/0847; H01L 21/76229; H01L 29/66568; H01L 29/0649; H01L 23/5226; H01L 21/8249; H01L 27/0635; H01L 27/0629
See application file for complete search history.

(56) References Cited

U.S. PATENT DOCUMENTS

| | | | |
|---|---|---|---|
| 5,913,125 A | 6/1999 | Brouillette et al. | |
| 7,755,163 B2 * | 7/2010 | Ogawa ................ | H01L 23/5252 257/530 |

(Continued)

FOREIGN PATENT DOCUMENTS

| | | |
|---|---|---|
| DE | 102011001527 A1 | 12/2011 |
| EP | 0764985 A2 | 3/1997 |

(Continued)

OTHER PUBLICATIONS

INPI Search Report and Written Opinion for FR 1355476 mailed Jan. 24, 2014 (8 pages).

(Continued)

*Primary Examiner* — Jarrett Stark
*Assistant Examiner* — Bitew Dinke
(74) *Attorney, Agent, or Firm* — Gardere Wynne Sewell LLP (57) ABSTRACT

An integrated circuit includes a substrate and at least one NMOS transistor having, in the substrate, an active region surrounded by an insulating region. The insulating region is formed to includes at least one area in which the insulating region has two insulating extents that are mutually separated from each other by a separation region formed by a part of the substrate.

14 Claims, 8 Drawing Sheets

(56) References Cited

U.S. PATENT DOCUMENTS

| | | | |
|---|---|---|---|
| 8,524,556 B1* | 9/2013 | Chiou | H01L 27/0629 257/380 |
| 8,779,526 B2* | 7/2014 | Hsu et al. | 257/379 |
| 8,847,319 B2* | 9/2014 | Liu et al. | 257/357 |
| 2004/0022102 A1* | 2/2004 | Liang et al. | 365/200 |
| 2004/0099912 A1 | 5/2004 | Chow et al. | |
| 2005/0285137 A1* | 12/2005 | Satoh | H01L 21/823807 257/178 |
| 2006/0014340 A1* | 1/2006 | Matsumori | 438/221 |
| 2007/0090417 A1* | 4/2007 | Kudo | H01L 21/28097 257/288 |
| 2007/0117306 A1* | 5/2007 | Oyamatsu | 438/232 |
| 2007/0132032 A1 | 6/2007 | Teo et al. | |
| 2007/0145522 A1 | 6/2007 | Oishi | |
| 2008/0017929 A1 | 1/2008 | Yi | |
| 2008/0036012 A1 | 2/2008 | Yang et al. | |
| 2008/0054413 A1 | 3/2008 | Dyer et al. | |
| 2008/0079097 A1 | 4/2008 | Inokuma | |
| 2008/0122002 A1 | 5/2008 | Pei et al. | |
| 2008/0179638 A1 | 7/2008 | Dyer et al. | |
| 2009/0001466 A1 | 1/2009 | Yang et al. | |
| 2009/0079000 A1 | 3/2009 | Yamazaki et al. | |
| 2009/0108463 A1 | 4/2009 | Pidin | |
| 2009/0206414 A1 | 8/2009 | Sudo | |
| 2009/0230439 A1* | 9/2009 | Wang | H01L 21/76802 257/288 |
| 2009/0294986 A1* | 12/2009 | Yan et al. | 257/774 |
| 2009/0309163 A1 | 12/2009 | Wang et al. | |
| 2010/0001369 A1* | 1/2010 | Chuang et al. | 257/526 |
| 2010/0022061 A1 | 1/2010 | Wu et al. | |
| 2010/0044802 A1* | 2/2010 | Ishibashi et al. | 257/401 |
| 2010/0059823 A1* | 3/2010 | Chung | H01L 21/823878 257/355 |
| 2010/0156510 A1 | 6/2010 | Botula et al. | |
| 2010/0270623 A1 | 10/2010 | Kirimura et al. | |
| 2010/0320509 A1 | 12/2010 | Knorr et al. | |
| 2011/0081765 A1 | 4/2011 | Cummings et al. | |
| 2011/0260294 A1* | 10/2011 | Oh | 257/607 |
| 2011/0318897 A1* | 12/2011 | Shang | H01L 21/76229 438/382 |
| 2012/0256266 A1 | 10/2012 | Itou et al. | |
| 2013/0015531 A1 | 1/2013 | Kim et al. | |
| 2013/0062680 A1* | 3/2013 | Kato et al. | 257/316 |
| 2013/0087861 A1* | 4/2013 | Chen | H01L 27/0629 257/379 |
| 2013/0105912 A1* | 5/2013 | Hsu | H01L 27/0629 257/379 |
| 2013/0270650 A1* | 10/2013 | Tseng | H01L 27/0629 257/379 |
| 2013/0277754 A1* | 10/2013 | Liang | H01L 27/0629 257/379 |
| 2014/0051222 A1* | 2/2014 | Terahara et al. | 438/296 |
| 2014/0138793 A1* | 5/2014 | Chidambaram | H01L 23/5228 257/532 |
| 2015/0129987 A1* | 5/2015 | Jeng | H01L 29/7833 257/408 |
| 2015/0255540 A1* | 9/2015 | Bouton | H01L 29/7846 257/368 |

FOREIGN PATENT DOCUMENTS

| | | |
|---|---|---|
| EP | 1858067 A1 | 11/2007 |
| JP | 2004165378 A | 6/2004 |
| WO | WO-2004038800 A2 | 5/2004 |

OTHER PUBLICATIONS

Gaetan Raymond: "Etude mecanique des films de nitrure de silicium fortementcontraints utilises pour augmenter les performances des transistors CMOS," Sep. 23, 2010, Extrait de l'Internet: URL: http://tel.archives-ouvertes.fr/docs/00/52/04/27/PDF/these_gaetan_Raymond.pdf, p. 9-p. 23.

* cited by examiner

COMPONENT, FOR EXAMPLE NMOS TRANSISTOR, WITH ACTIVE REGION WITH RELAXED COMPRESSION STRESSES, AND FABRICATION METHOD

PRIORITY CLAIM

This application claims priority from French Application for Patent No. 1355476 filed Jun. 13, 2013, the disclosure of which is incorporated by reference.

TECHNICAL FIELD

The invention relates to integrated circuits, and more specifically to the relaxing of the compression stresses of an active region, for example that of an NMOS transistor.

BACKGROUND

In an integrated circuit, the transistors are produced in and on a semiconductive active region, for example of silicon, surrounded by an electrically insulating region, for example a trench filled for example with silicon dioxide.

The fact of producing an MOS transistor in an insulating region intrinsically causes a compression-stressed active region to be obtained through the presence at its periphery of the insulating region. Also, while a compression-stressed active region favors the efficiency of a PMOS transistor, it by contrast causes the efficiency of an NMOS transistor to be degraded, notably in terms of carrier mobility.

Moreover, the production of fast transistors demands small channel lengths and widths and the structures generally produced exhibit a significant density, which leads to active region dimensions that are very small, even minimal for the technology concerned.

It is therefore extremely difficult, even impossible, to increase the dimensions of the active regions of the NMOS transistors in order to relax their compression stresses, given the density sought for the structures produced.

SUMMARY

According to one embodiment, it is proposed to reduce the compression stresses in the active region of a component unfavorably sensitive to the compression stresses, for example an NMOS transistor, or else an active resistor, that is to say one formed in an active region whose resistive value can vary with the compression stresses, and to do so without modifying the specifications of the PMOS transistors.

According to one aspect, an integrated circuit is proposed comprising a substrate and at least one component unfavorably sensitive to compression stresses, for example an NMOS transistor, arranged at least partially in an active region of the substrate limited by an insulating region.

According to a general feature of this aspect, said insulating region comprises at least one area in which it has two insulating extents mutually separated by a separation region formed by a part of the substrate.

Thus, according to this aspect, a separation wall is produced in the insulating region, formed by a part of the substrate, in order to absorb a part of the stresses generated by the insulating region. Moreover, since this wall is produced in the insulating region, its production is totally transparent for the designer of the integrated circuit since the latter simply determines the dimensions of the active region and of the insulating region without worrying about the content of this insulating region, that is to say, in this case, the presence of a wall in this insulating region. In practice, this wall is mechanically active to allow for an absorption of the stresses, but totally electrically inactive (floating). Also, the definition of the positioning of this wall is advantageously performed directly and automatically at the point of generation of the active region mask without the intervention of the designer and without this separation wall interfering with the transistor for example.

The component unfavorably sensitive to the compression stresses of its active region can be an NMOS transistor or else an active resistor, that is to say one formed in said active region, without these two examples being limiting.

Moreover, an additional insulating region is arranged over the component, the active region and the insulating region, and separates the component from the first metallization level. Also, said separation region or wall is advantageously also covered by said additional insulating region.

According to one embodiment, said separation region has a top face situated substantially at the same level as said top face of the active region and emerges in a bottom region of the substrate.

In other words, the depth of this separation wall is substantially equal to the depth of the insulating region.

So as to allow for a more effective relaxing of the compression stresses in the active region, the insulating extent situated closest to said active region has a volume less than or equal to that of the insulating extent furthest away from the active region.

According to one embodiment, said separation region at least partially surrounds said active region.

Moreover, according to one embodiment, the gate region of the transistor has a part extending over the insulating region outside of and at a minimal distance from said area of the insulating region, that is to say from the area containing said separation region or wall.

In practice, not only must this separation region or wall not be situated under the polysilicon line, for example, of the gate region of the transistor, so as not to create a spurious transistor, but it must also be situated at a minimum distance from this polysilicon line so as to comply with the design rules (design rules manual) of the technology concerned and avoid the spurious effects.

As indicated above, an additional insulating region is arranged over the component, the active region and the insulating region, and separates the component from the first metallization level. Also, according to another embodiment, said integrated circuit comprises at least one contact region passing through said additional insulating region and contacting at least the top face of a portion of said insulating region, said at least one contact region being formed by at least one material different from the materials forming said insulating region and said additional insulating region.

This contact region can have the form of a wall that can at least partially surround said component.

Said at least one material forming the contact region can comprise a metal, for example tungsten, or else polysilicon without these two examples being limiting.

In practice, it is observed that producing a contact passing through said additional insulating region and in particular the insulating bottom layer (known to those skilled in the art by the acronym CESL, standing for Contact Etch Stop Layer) of this additional insulating region in order to simply contact the insulating region, even penetrate very slightly into this insulating region by virtue of an overetching, would also make it possible to relax the compression stresses in the active region of the component. In practice, said at least one material, for example a metal, forming this contact region is generally a tension-stressed material.

This contact region, for example metallic, whose positioning is defined on the "contacts" mask, is mechanically active for the relaxing of the stresses but electrically inactive since one of the ends is in contact with an insulating region.

Also, such a contact region, for example metallic, can for example be produced on a point of the insulating region where it is not possible, for dimensional regions, to produce a separation wall, the separation wall being produced, for its part, in another point of the insulating region.

Thus, a component, for example an NMOS transistor, equipped with a separation wall and at least one such metallic contact region, has an active region that is even more relaxed in terms of compression stresses.

It is however preferable, to further relax the compression stresses, for the contact region, for example metallic, to penetrate notably depth-wise into said portion of the insulating region.

Moreover, it is advantageous for said portion of insulating region with which said contact comes into contact, for example metallic, or into which said contact penetrates, to belong to that of the insulating extents separated by the separation wall which is situated closest to said active region.

Thus, in this embodiment, there is provided the combination of a separation wall in the insulating region and of a contact, for example metallic, coming at least into contact with, even penetrating into, the insulating extent situated closest to the active region.

A notable effectiveness in the relaxing of the compression stresses of the active region is then obtained.

When the integrated circuit comprises an additional insulating region comprising a compressed bottom insulating layer (CESL layer for example) arranged over the component, the active region and the insulating region, this compressed bottom insulating layer over the transistor and the insulating region also contributes to the presence of the compression stresses in the active region. Also, a relaxing of compression stresses in said active region can be obtained by at least one protuberance arranged over at least a part of said insulating region and below said compressed bottom insulating layer.

In other words, this protuberance locally raises said compressed bottom insulating layer, which therefore allows for a relaxing of compression stresses in said active region.

When the component is an NMOS transistor, said protuberance advantageously has a structure similar to that of the gate region of the transistor.

This protuberance can at least partially surround the component, for example an active resistor.

That said, when the component is an NMOS transistor, the gate region of which has a part extending over the insulating region, this gate region part is at least at a minimal distance from said protuberance, so as not to create a spurious structure and to comply with the design rules (DRM) of the technology concerned.

This protuberance, whose positioning is defined on the "poly" mask, is mechanically active for the relaxing of the stresses but electrically inactive (floating) because it is not electrically connected.

According to another aspect, there is proposed a method for fabricating a component unfavorably sensitive to compression stresses, for example an NMOS transistor, comprising a production in a substrate, of an insulating region limiting an active region of the substrate, and a production of the component at least partially in the active region.

According to a general feature of this other aspect, the production of said insulating region comprises, in at least one area of this insulating region, a production of two insulating extents mutually separated by a separation region formed by a part of the substrate.

According to one implementation, the production of the two extents comprises a formation, in the substrate, of two separate trenches and a filling of these trenches by at least one insulating material.

According to one implementation, the definition of the positioning of said two trenches is performed on the active region mask.

According to one implementation, the method also comprises the production of an additional insulating region over the component, the active region and the insulating region, and a production of at least one contact region, for example metallic, passing through said additional insulating region and contacting at least the top face of a portion of said insulating region, said at least one contact region being formed by at least one material different from the materials forming said insulating region and said additional insulating region.

According to another implementation, the method also comprises a production, over the component, the active region and the insulating region, of an additional insulating region comprising a compressed bottom insulating layer and a production of at least one protuberance over at least a part of said insulating region and under said compressed bottom insulating layer.

When the component is an NMOS transistor, said protuberance has a structure similar to that of the gate region of the transistor and is produced at the same time as said gate region.

According to another aspect, there is proposed a use of at least one separation region formed by a part of a substrate incorporating an active region of a component unfavorably sensitive to compression stresses in said active region, to separate into two insulating extents at least a part of an insulating region limiting said active region to obtain a relaxing of compression stresses in said active region.

According to another aspect, there is proposed a use of at least one separation region formed by a part of a substrate incorporating an active region of a component unfavorably sensitive to compression stresses in said active region, to separate into two insulating extents at least a part of an insulating region limiting said active region, and of at least one contact region, for example metallic, passing through an additional insulating region arranged over the component, the active region and the insulating region, formed by at least one material different from the materials forming said insulating region and said additional insulating region, and contacting at least the top face of a portion of said insulating region, to obtain a relaxing of compression stresses in said active region.

According to another aspect, there is proposed a use of at least one separation region formed by a part of a substrate incorporating an active region of a component unfavorably sensitive to compression stresses in said active region, to separate into two insulating extents at least a part of an insulating region limiting said active region, of at least one contact region passing through an additional insulating region comprising a compressed bottom insulating layer arranged over the component, the active region and the insulating region and comprising a compressed bottom insulating layer, formed by at least one material different from the materials forming said insulating region and said additional insulating region, and contacting at least the top face of a portion of said insulating region and of at least one protuberance arranged over at least a part of said insulating region and under said compressed bottom insulating layer, to obtain a relaxing of compression stresses in said active region.

BRIEF DESCRIPTION OF THE DRAWINGS

Other advantages and features of the invention will become apparent on studying the detailed description of non-limiting embodiments and implementations, and the appended drawings in which.

DETAILED DESCRIPTION OF THE DRAWINGS

Throughout the following text, the component unfavorably sensitive to compression stresses is an NMOS transistor.

Figure 1:
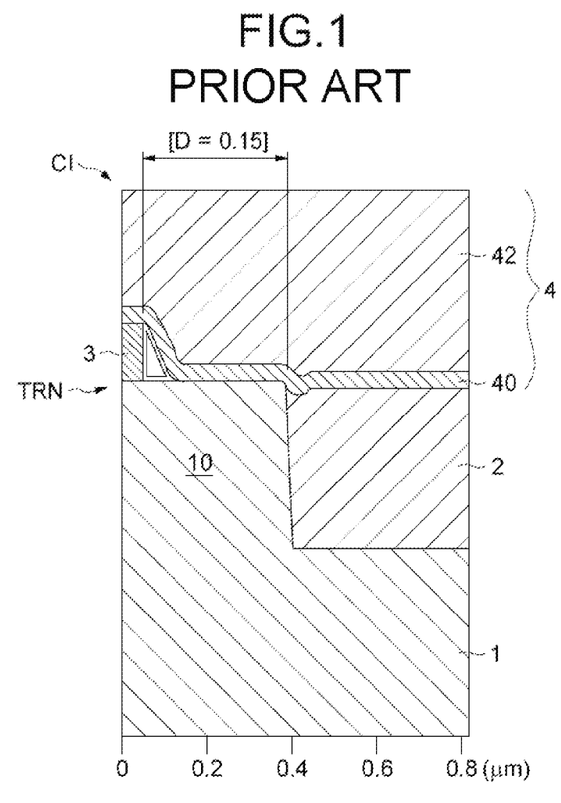
FIG. 1 schematically illustrates an NMOS transistor of the prior art.

FIG. 1, the reference TRN designates an NMOS transistor whose active region 10 is situated in a semiconductive substrate 1, for example of silicon. The active region is surrounded by an insulating region 2, for example of trench type.

The transistor TRN, forming part of an integrated circuit CI, conventionally comprises a gate region 3. Moreover, the gate region 3, the active region 10 and the insulating region 2 are covered by an additional insulating region 4 conventionally comprising an insulating bottom layer 40, for example of silicon nitride, also referred to by those skilled in the art by the acronym CESL (Contact Etch Stop Layer). The additional insulating region 4 also comprises at least one other layer over the layer 40, for example at least one layer 42 of silicon dioxide.

The transistor TRN is produced here in a 90 nanometer technology and the distance D between the gate region 3 and the insulating region 2, that is to say the length of the source or drain region, is here equal to 0.15 micrometers.

Figure 2:
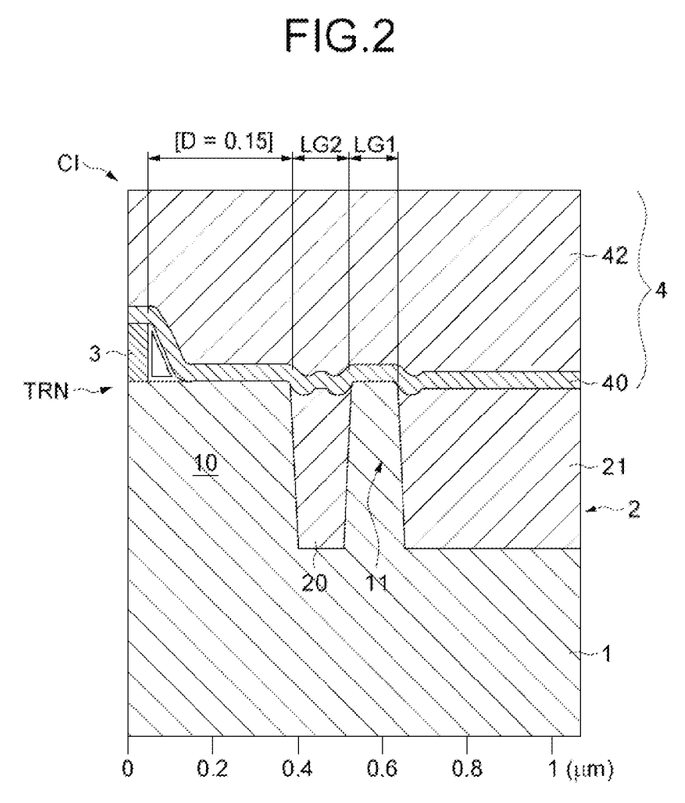
FIG. 2 illustrates an embodiment of an NMOS transistor.

Compared to the transistor TRN of FIG. 1, the transistor TRN according to the embodiment illustrated in FIG. 2 comprises, in the insulating region 2, a separation region 11, formed by a part of the substrate 1, and separating the insulating region 2 into two insulating extents 20 and 21.

The separation region is also covered by said additional insulating region 4.

Moreover, the top face of the separation wall 11 is situated substantially at the same level as the top face of the active region 10 and this separation wall emerges in the bottom part of the substrate 1. The width LG1 of the separation region 11 is here equal to the critical dimension CD of the technology considered, in this case 0.11 micrometers. This critical dimension is the minimum dimension of an active region line.

The width LG2 of the insulating extent 20 is here equal to the minimum spacing between two active regions defined by the design rules (Design Rules Manual DRM) of the technology concerned, in this case 0.14 micrometers for a 90 nanometer technology.

This separation region absorbs the stresses produced by the insulating extent 21 and, because of this, the stresses in the active region 10 result essentially only from the insulating extent 20 which has a reduced volume compared to the overall volume of the insulating region 2 in the prior art configuration illustrated in FIG. 1.

Thus, this embodiment of FIG. 2 makes it possible to obtain a mobility gain of 20% compared to a conventional prior art transistor TRN such as that illustrated in FIG. 1.

Figure 3:
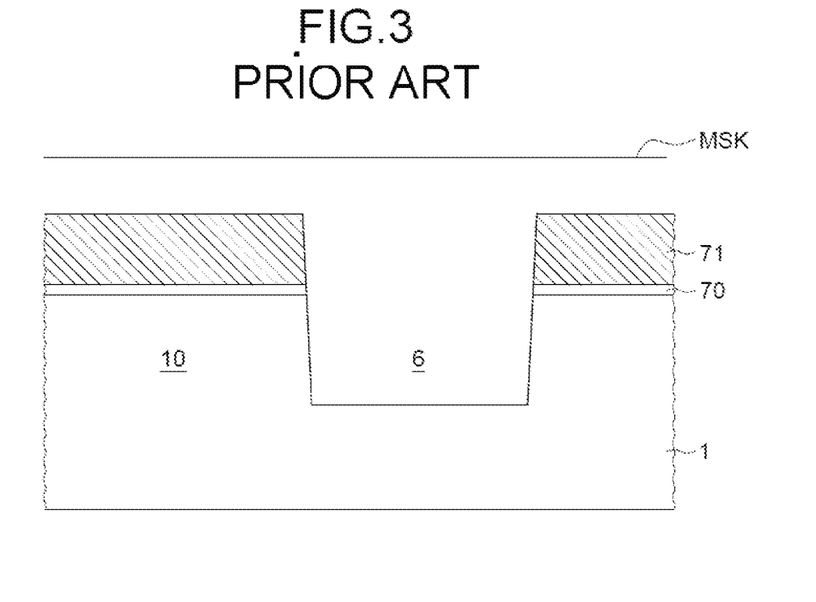
FIG. 3 schematically illustrates a production of an insulating region according to the prior art.

FIG. 3 schematically illustrates the production of the insulating region 2 delimiting the active area 10 of the transistor TRN of FIG. 1.

A bilayer 70 (silicon oxide/silicon nitride) is deposited on the substrate 1, topped by a layer of photosensitive resin 71 that is exposed to light through a mask MSK called "active mask" or "active region mask", which will make it possible to determine the outlines of the insulating region 2 and consequently those of the active region. Then, after the resin has been developed, the bilayer 70 and the substrate 1 are etched using the remaining part of the resin 71 as hard mask so as to obtain a trench 6 which will be filled with insulating material so as to form the insulating region 2 of the transistor TRN.

Compared to this prior art, the method according to one implementation of the invention provides (FIG. 4) for defining, in the active mask MSK, the positions of the two insulating extents separated by the separation region (separation wall). More specifically, after the resin 71 has been exposed to light and developed, there remain, on the bilayer 70, blocks of resin which will be used as hard masks for the production of two trenches 60 and 61 in the bilayer 70 and the substrate 1. These two trenches are de facto separated by the separation wall 11 and will be filled with the insulating material to produce the two insulating extents 20 and 21 of the transistor of FIG. 2.

Figure 4:
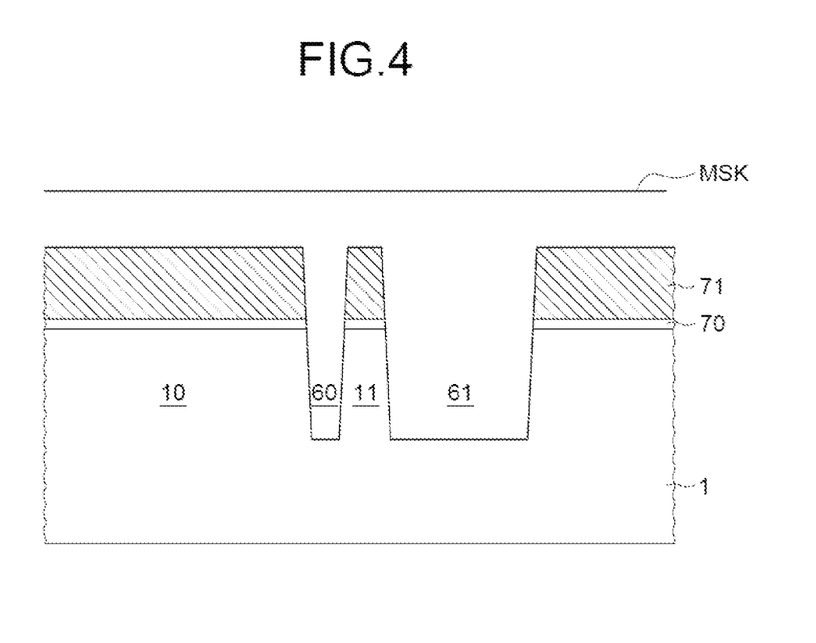
FIG. 4 illustrates an implementation of a method for producing an insulating region, and FIGS. 5 to 13 schematically illustrate other embodiments of an integrated circuit.

It will be noted here that the trenches 60 and 61 are situated within the outline of the insulating region 6.

Also, it is this outline which is defined by the designer when defining the dimension of the active regions. Consequently, the fact of providing, in the mask MSK, two trenches in this insulating region is totally transparent to the designer, and all the more so since the separation wall 11 is electrically inactive.

The defining of these trenches is advantageously performed automatically in the generation of the active mask by taking account of different dimensions which will be returned to in more detail hereinbelow.

Figure 5:
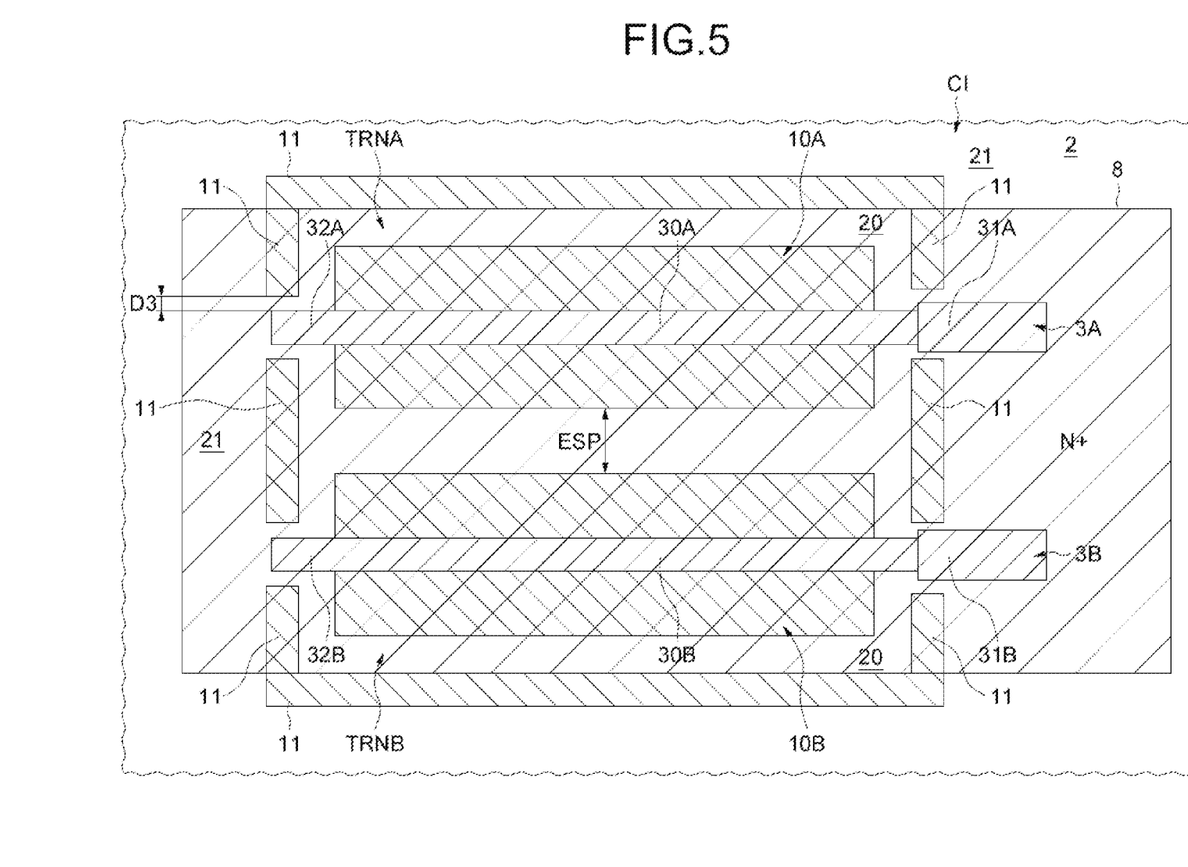

The integrated circuit CI illustrated in FIG. 5 comprises two NMOS transistors TRNA, TRNB. The transistor TRNA comprises an active region 10A surrounded by the insulating region 2 and the transistor TRNB comprises the active region 10B also surrounded by the insulating region 2.

The transistor TRNA comprises a gate region 3A formed, for example, by a polysilicon line. This gate region 3A comprises a part 30A situated over the active region 10A, a part 31A extending beyond a first end of the active region and allowing for a contact on the gate region and another part 32A extending beyond the second end of the active region.

The gate region 3B of the transistor TRNB has a structure similar to the gate region 3A. More specifically, it comprises a central part 30B situated over the active region 10B and two parts 31B and 32B extending beyond this active region 10B.

The area 8 represents the N+ implantation area of the two NMOS transistors. Elsewhere it can be seen that the integrated circuit CI comprises, around the two transistors TRNA and TRNB, a separation region 11 formed in the insulating region 2 and separating the latter into several pairs of insulating extents 20, 21.

In this embodiment, the space ESP between the two active regions 10A and 10B is not sufficient to allow for the formation of a separation region between these two active regions. In practice, this space has to be at least equal to two times the minimum gap LG2 between two active regions plus the critical dimension LG1, i.e. 0.39 micrometer for a 90 nanometer technology.

Moreover, the parts 31A, 32A, 31B and 32B of the gate regions 3A and 3B are situated outside the area in which the separation region 11 is situated.

More specifically, these parts do not overlap a part of the separation wall 11 so as not to form a spurious transistor, and the distance D3 between an end of the separation region 11 and a gate region part, for example the part 32A, must be greater than a minimum distance, for example 0.05 micrometers in the technology concerned, in this case the 90 nanometer technology.

Thus, the dimensions LG1, LG2, D3 and ESP are used automatically in the computer tool for generating the active mask to determine, as a function of the positions of the different active regions 10 and insulating regions 2, the possible locations of the separation wall or walls in these insulating regions and the geometries and dimensions of the or these separation wall(s).

And this is done automatically without the intervention of the circuit designer and totally transparently for said designer.

Figure 6:
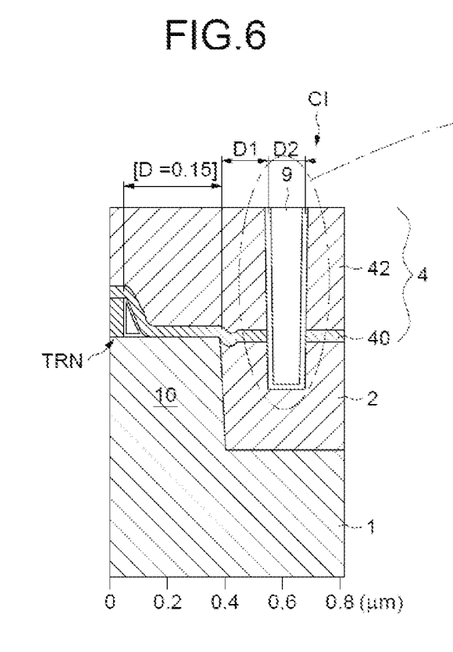
Figure 7:
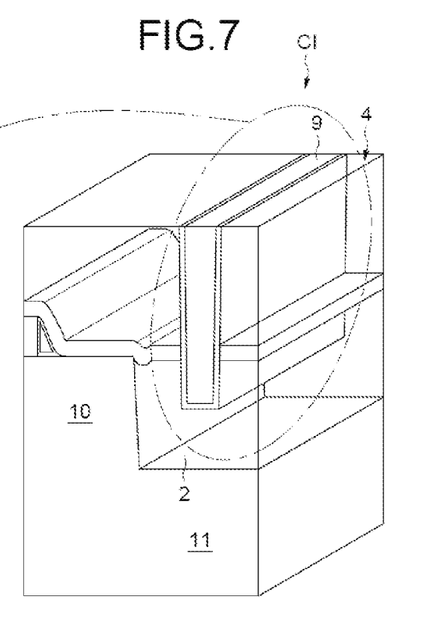

In the embodiments illustrated in FIGS. 6 and 7, the relaxing of the stresses in the active region 10 of the transistor TRN is obtained by a metallic contact 9 passing through the additional insulating region 4 so as to, in the present case, penetrate into the insulating region 2.

Figure 8:
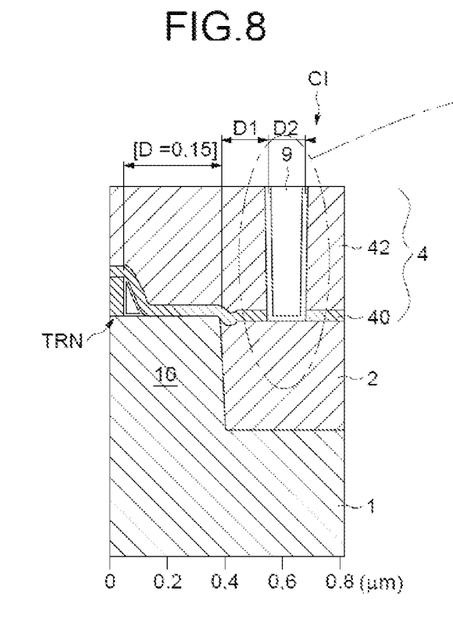
Figure 9:
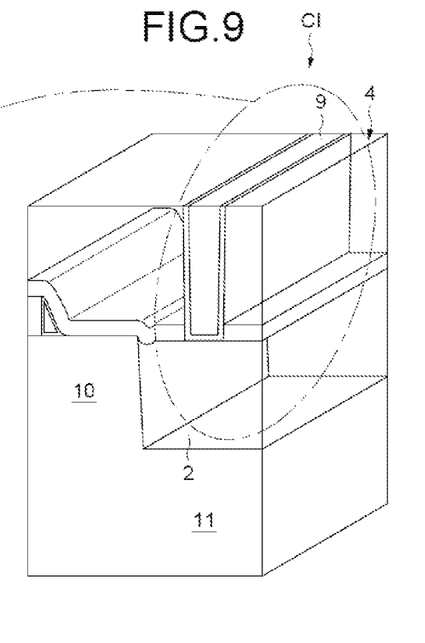

That said, it is observed that even if the metallic contact 9 passes only through the insulating region 4, and notably the CESL layer 40, without penetrating into the insulating region 2, as illustrated in FIGS. 8 and 9, a relaxing of the compression stresses is nevertheless obtained in the active region 10 of the transistor TRN compared to the compression stresses of the region 10 of the transistor TRN of FIG. 1.

And this holds true whether the layer 40 is a compressed layer or a tension layer because, in the latter case, the material used for the contact region 9 is generally a material that is itself tensioned. Also, the inventors have observed that the combination of a tensioned layer 40 passed through by a contact region which is itself tensioned made it possible to increase the tension in the channel region which makes it possible to increase the mobility of the electrons.

As an indication, such an embodiment (FIGS. 8 and 9) makes it possible to obtain a mobility gain of 20% compared to a transistor TRN of the prior art such as that illustrated in FIG. 1. The mobility gain is greater for the embodiment of FIGS. 6 and 7 and depends on the depth of penetration of the contact 9 into the insulating region 2.

Such a metallic contact 9 is produced in a way similar to the metallic contacts intended to contact the source, drain and gate regions of the transistor to link them to a metallization level of the interconnect part (BEOL: Back End Of Lines) of the integrated circuit.

That said, this metallic contact 9, whose positioning is defined on the "contacts" mask, and whose geometry can be different from that of the conventional contacts intended to contact the source, drain and gate regions, is mechanically active for the relaxing of these stresses, but electrically inactive since one of the ends is in contact with an insulating region.

The use of metallic contacts coming into contact with the insulating region 2, even penetrating into this insulating region 2, is particularly advantageously when the space between two active regions of two NMOS transistors is not sufficient to produce a separation wall 11. In practice, the dimensional constraints to be observed to produce a metallic contact are less strict than those governing the production of a separation wall 11.

Thus, in the 90 nm technology for example, the minimum width D2 of a contact region 9 is equal to 0.12 micrometer and the minimum distance D1 between a contact region 9 and the active region edge is equal to 0.10 micrometers.

By analogy with the generation of the active mask, the dimensions D1 and D2 are used automatically in the computer tool for generating the "contacts" mask to determine, as a function of the positions of the different active regions 10 and insulating regions 2, the possible locations of the contact region or regions 9 contacting or penetrating into these insulating regions as well as the geometries and dimensions of the or these contact region(s).

And here again, this is done automatically without the intervention of the circuit designer and totally transparently for said designer.

Figure 10:
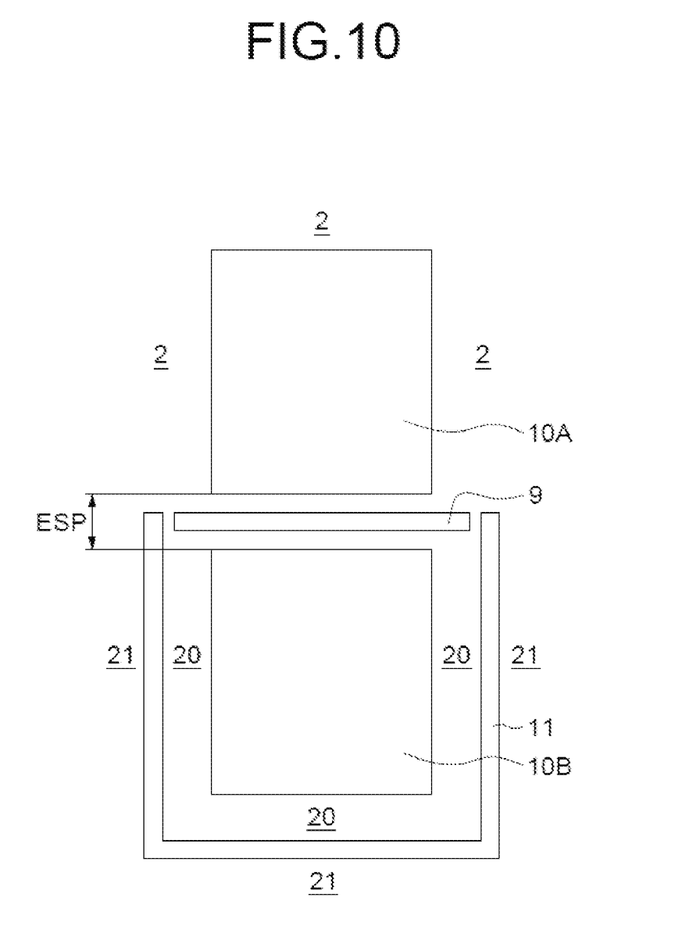

A configuration combining separation wall 11 and contact wall 9 is very schematically illustrated notably in FIG. 10.

In this FIG. 10, the two active regions 10A and 10B of two NMOS transistors are separated by a space ESP that is insufficient to produce a separation wall 11. In this case, a metallic contact 9 is produced, extending between the two active regions 10A and 10B, and either coming into contact with the insulating region 2 or penetrating into this insulating region.

Moreover, it is possible, in combination, as illustrated in FIG. 10, to produce, around the remaining part of the active region 10B, a separation wall 11 in the insulation region 2 so as to define two insulating extents 20 and 21.

Figure 11:
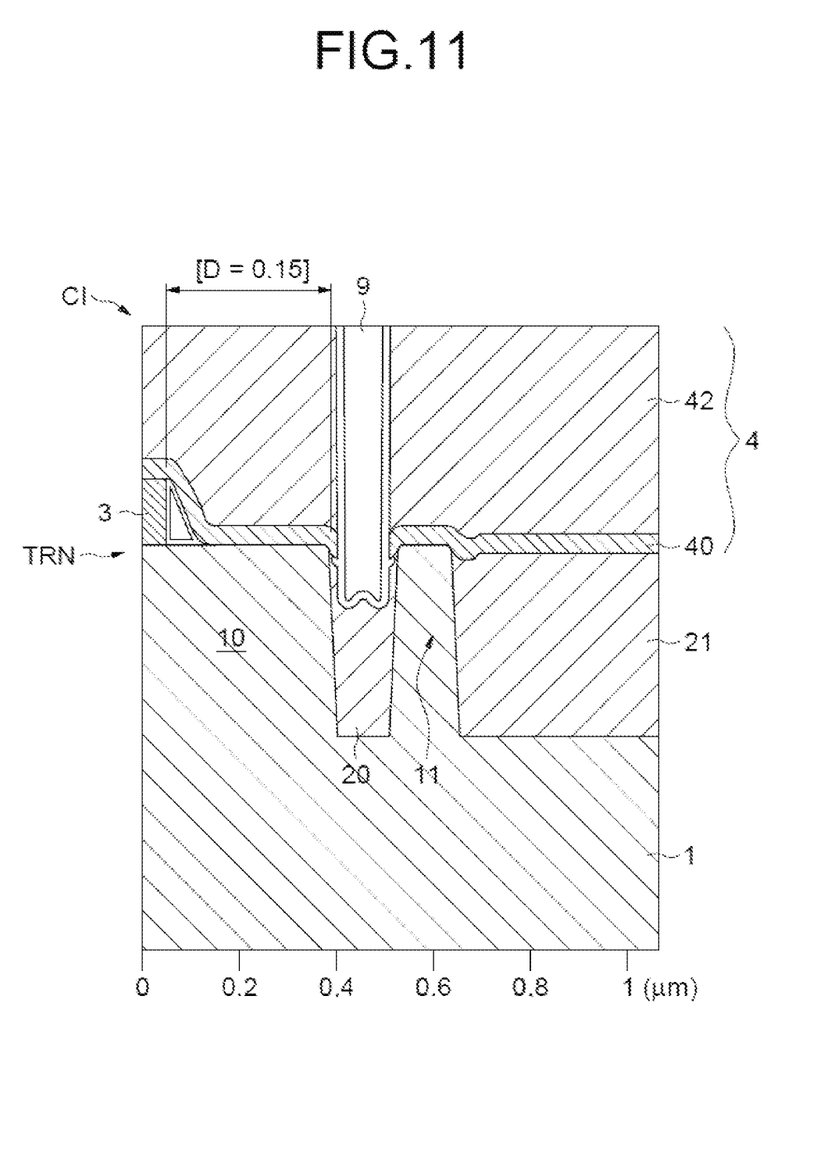

Whereas in the embodiment of FIGS. 6 to 10 the contact, for example metallic, came into contact with the insulating region 2 or penetrated into this insulating region 2, the contact, for example metallic, 9, can also, as illustrated in FIG. 11, come into contact with or penetrate into one of the two insulating extents 20 and 21 of the insulating region 2 separated by the separation wall 11. That said, it is preferable for the metallic contact to come into contact with the insulating extent 20 situated closest to the active region 10 so as to make the relaxing of the stresses in the active region all the more effective.

Also, as an indication, the mobility gain of a transistor TRN such as that illustrated in FIG. 11 is 50% compared to the transistor TRN of FIG. 1.

Figure 12:
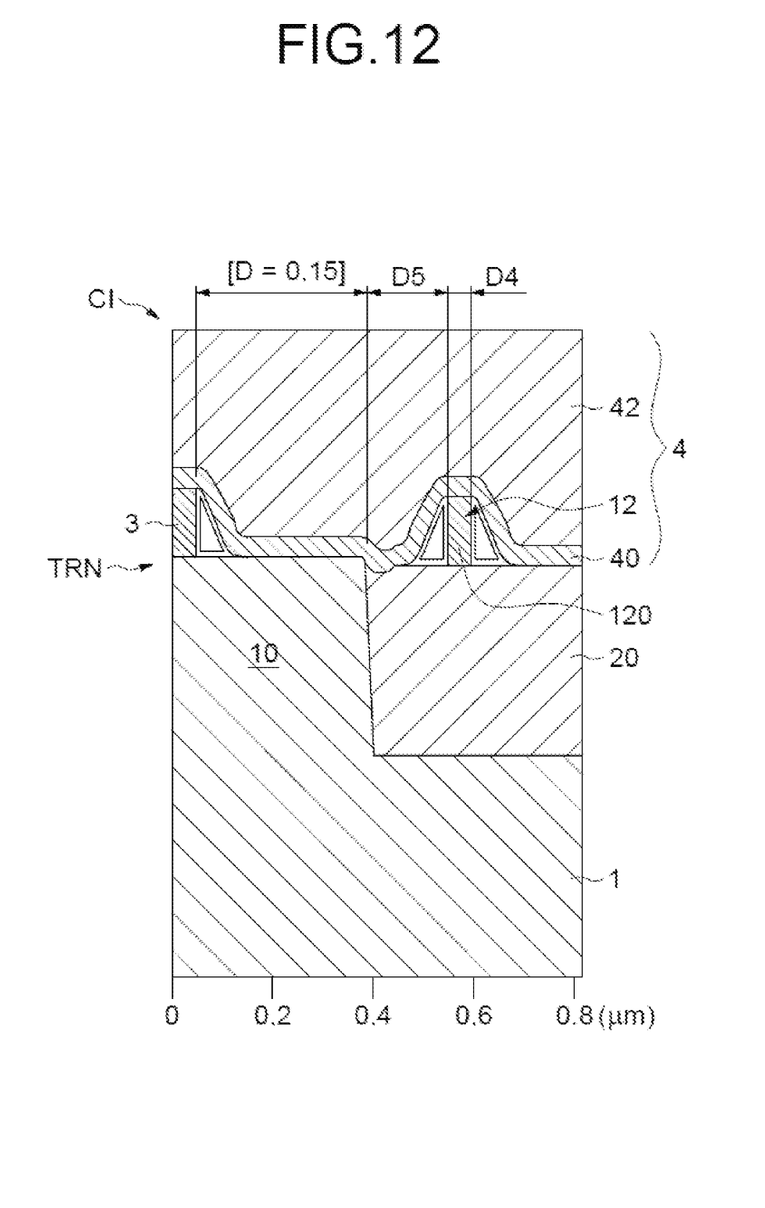
Figure 13:
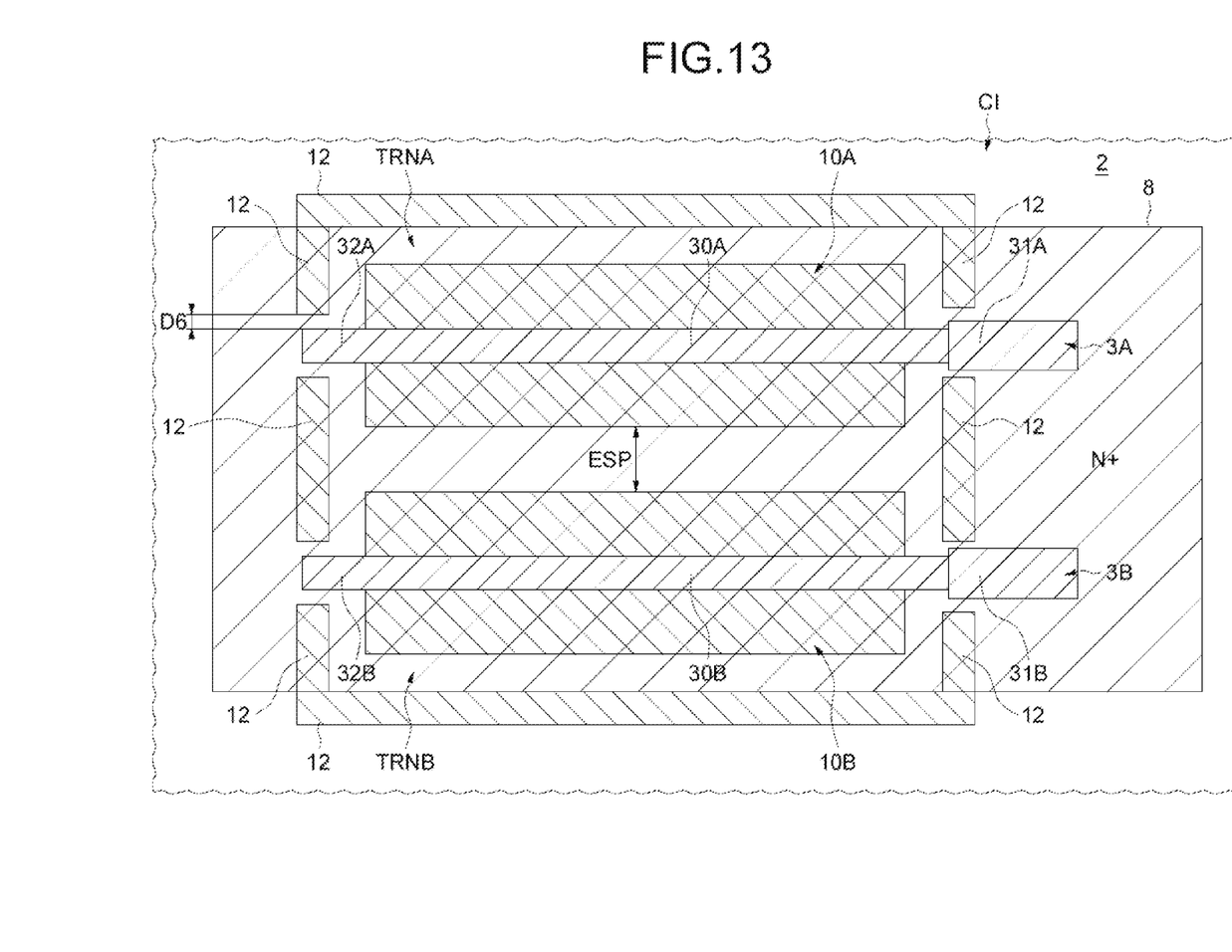

In the embodiments illustrated in FIGS. 12 and 13, the bottom insulating layer 40 is a compression-stressed layer. And the relaxing of the stresses in the active region 10 of the transistor TRN is obtained by a protuberance 12 resting on the insulating region and situated under the bottom insulating layer 40.

In other words, this protuberance locally raises the bottom insulating layer 40, which allows for a relaxing of the compression stresses in the active region 10.

As illustrated in FIG. 12, when the component unfavorably sensitive to compression stresses is an NMOS transistor TRN, this protuberance advantageously has a structure similar to that of the gate region 3 of the transistor. This protuberance then comprises, for example, polysilicon in its central part 120.

In the 90 nm technology for example, the minimum width D4 of the central part of a protuberance 12 is equal to 0.1 micrometer and the minimum distance D5 between a central part of a protuberance 12 and the active region edge is equal to 0.05 micrometers.

The integrated circuit of FIG. 13 has a structure identical to that illustrated in FIG. 5.

In this embodiment, the space ESP between the two active regions 10A and 10B is not sufficient to allow for the formation of a protuberance between these two active regions. In practice, this space must be at least equal to two times the minimum spacing D5 plus the minimum width D4, i.e. 0.02 micrometers for a 90 nanometer technology.

However, it is possible to produce a protuberance 12 on the insulating region 2 which partially surrounds the two active regions 10A and 10B, but with precautions that must be taken in the gate regions.

More specifically, the parts 31A, 32A, 31B and 32B of the gate regions 3A and 3B are situated over the insulating region, and in such a way that a protuberance 12 does not form a spurious structure, the distance D6 between one end of the protuberance 12 and a gate region part, for example the part 32A, must be greater than a minimum distance, for example 0.14 micrometers in the technology concerned, in this case the 90 nanometer technology.

The production of the protuberance 12 is performed at the same time as the production of the gate region 3 and with production steps identical to those used for the production of this gate region.

More specifically, after having produced, by deposition and etching, the central part of the gate region 3 and the central part 120 of the protuberance 12, these central parts of insulating lateral regions or spacers are flanked. Then, the additional insulating region 4 is produced with the compressed bottom layer 40.

The positioning and the geometry of the central part 120 of polysilicon of the protuberance 12 are defined in the "poly" mask used to define the positions and geometries of the gate regions of the transistors.

Also, by analogy with the generation of the active mask, the dimensions D4, D5 and D6 are used automatically in a computer tool for generating the "poly" mask to determine, as a function of the positions of the different active regions 10 and insulating regions 2, the possible locations of the protuberance or protuberances 12 as well as the geometries and dimensions of the or these protuberance(s).

And here again, this is done automatically without the intervention of the circuit designer and totally transparently for said designer.

Obviously, it is possible to combine separation wall and/or contact region and/or protuberance in an integrated circuit.

If, for example in the embodiment of FIG. 13, the value of the space ESP between the two active regions is less than 2LG2+LG1 (0.39 micrometers in the 90 nanometer technology) and less than 2D1+D2 (0.32 micrometer in the 90 nanometer technology), then it is not possible to produce at this point any separation wall or contact region, but if this space is, however, greater than 2D5+D4 (0.20 micrometers in the 90 nanometer technology) a protuberance 12 can be inserted between these two active regions 10A and 10B.

And simply by placing a protuberance 12 between these two active regions, it would be possible, for example, to replace the periphery protuberance 12 of FIG. 13 with a separation wall 11.

What is claimed is:

1. An integrated circuit, comprising:
a substrate;
an insulating region delimiting an active region of the substrate, wherein said insulating region comprises:
a first insulating material in a first trench that surrounds the active region; and
a second insulating material in a second trench that also surrounds said active region, wherein the second trench is separated from the first trench by a separation wall formed by a portion of said substrate, wherein said separation wall discontinuously surrounds the active region so that at one or more locations around the active region the first and second trenches are connected to each other; and
at least one component unfavorably sensitive to compression stresses arranged at least partially in the active region.

2. The integrated circuit according to claim 1, further comprising:
an additional insulating region comprising a compressed bottom insulating layer and arranged over the component, the active region and the insulating region; and
at least one protuberance arranged over at least a part of said insulating region and below said compressed bottom insulating layer.

3. The integrated circuit according to claim 2, in which said component is an NMOS transistor.

4. The integrated circuit according to claim 3, wherein said protuberance has a structure similar to that of a gate region of the NMOS transistor.

5. The integrated circuit according to claim 4, wherein the gate region of the NMOS transistor has a part extending over the insulating region and separated from said protuberance.

6. The integrated circuit according to claim 1, wherein the at least one component comprises a transistor with a control gate, said control gate extending over the substrate and passing over said one or more locations around the active region where the first and second trenches are connected to each other.

7. The integrated circuit according to claim 6, wherein said transistor comprises an NMOS transistor.

8. The integrated circuit according to claim 1, wherein said separation wall has a top surface situated at a same level as a top surface of the active region.

9. The integrated circuit according to claim 1, wherein the first trench has a cross-sectional area less than a cross-sectional area of the second trench.

10. The integrated circuit according to claim 1, further comprising an insulating layer disposed over the component, the active region and the insulating region, and wherein said separation wall is covered by said insulating layer.

11. The integrated circuit according to claim 10, further comprising a contact passing through said insulating layer and contacting a portion of said insulating region.

12. The integrated circuit according to claim 11, wherein said contact is formed by a material that is different from said first and second insulating materials.

13. The integrated circuit according to claim 12, wherein the material forming said contact comprises a metal.

14. The integrated circuit according to claim 11, wherein the contact penetrates into the first insulating material filling said first trench.

* * * * *